United States Patent
Yoo

(10) Patent No.: US 6,744,678 B2
(45) Date of Patent: Jun. 1, 2004

(54) SEMICONDUCTOR MEMORY DEVICE CAPABLE OF MASKING UNDESIRED COLUMN ACCESS SIGNAL

(75) Inventor: Seong-Nyuh Yoo, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/237,104

(22) Filed: Sep. 9, 2002

(65) Prior Publication Data

US 2003/0058695 A1 Mar. 27, 2003

(30) Foreign Application Priority Data

Sep. 24, 2001 (KR) .......................... 2001-58971

(51) Int. Cl.[7] .................................. G11C 7/00
(52) U.S. Cl. .............. 365/191; 365/230.06; 365/189.01
(58) Field of Search .................. 365/191, 193, 365/195, 189.01, 189.04, 230.01, 230.06, 230.08, 63

(56) References Cited

U.S. PATENT DOCUMENTS

| 5,528,551 A | 6/1996 | Pinkham |
| 5,612,922 A | 3/1997 | McLaury |
| 5,787,046 A | * 7/1998 | Furuyama et al. ...... 365/230.03 |
| 5,867,447 A | 2/1999 | Koshikawa |
| 5,940,328 A | 8/1999 | Iwamoto et al. |
| 6,151,272 A | 11/2000 | La et al. |
| 6,175,534 B1 | 1/2001 | Taniguchi et al. |
| 6,208,582 B1 | * 3/2001 | Kanda et al. ................ 365/233 |

FOREIGN PATENT DOCUMENTS

| JP | 07-220477 | 8/1995 | ............ G11C/11/41 |
| JP | 09-320258 | 12/1997 | ......... G11C/11/401 |
| JP | 10-241362 | 9/1998 | ......... G11C/11/407 |
| JP | 2000-132964 | 5/2000 | ......... G11C/11/407 |
| KR | 1999-85199 | 12/1999 | ......... G11C/11/407 |
| KR | 2001-10042 | 2/2001 | ......... G11C/11/409 |

* cited by examiner

Primary Examiner—Gene Auduong
(74) Attorney, Agent, or Firm—Jacobson Holman PLLC

(57) ABSTRACT

A semiconductor memory device includes a masking unit for masking the generation of an undesired column access signal by using a write data masking signal, wherein the masking unit includes an address receiver for receiving control signals including a write data masking signal, a bank address column signal and a read/write strobe signal and a column address decoder for outputting a column access signal.

4 Claims, 4 Drawing Sheets

SEMICONDUCTOR MEMORY DEVICE CAPABLE OF MASKING UNDESIRED COLUMN ACCESS SIGNAL

FIELD OF THE INVENTION

The present invention relates to a semiconductor memory device and, more particularly, to a semiconductor memory device capable of masking an undesired column access signal.

DESCRIPTION OF THE PRIOR ART

FIG. 1A is a schematic circuit diagram showing a path to write data into a memory cell 150 and FIG. 1B is a timing chart for the circuit diagram of a prior art shown in FIG. 1A.

Conventionally, when a data masking signal reaches an active level, global input/output data lines GIO/GIOZ, which are inputted into a write driver 110, are masked. Namely, data, which are in global input/output data lines GIO/GIOZ, are not transmitted into local input/output data lines so that the data are not written in the memory cell 150. However, a column access signal Yi, which is a control signal selecting column lines, is not masked.

The column access signal Yi increases the voltage level of the bit line bar BLZ by transmitting the voltage of sub input/output lines SIO/SIOZ charged to an internal voltage level of Vintc bit lines BL/BLZ (NOT SHOWN). When the column access signal Yi disappears, the increased voltage level of the bit line bar BLZ returns to the original voltage level by the operation of a bit line sense amplifier 140. However, if a precharge command is applied before the increased voltage level of the bit line bar BLZ returns to the original voltage level, the third NMOS transistor NM3 is turned off because the voltage level of the word line WL becomes a low voltage level in the memory cell 150. At this time, since the capacitor in the memory cell 150 is still charged with the increased voltage level, an original data, '0', representing the discharged state of the capacitor, is lost. The bank write enable signal bwen inputted into the write driver 110 is a flag signal to enable the write of a bank. A block selection signal bs is a gate control signal to control the first NMOS transistor NM1 in the block selection unit 120.

A write signal and data are inputted into the write driver 110 through the global I/O lines with a bank write enable signal bwen. Then the data inputted through the global input/output data lines GI0/GI0Z are transmitted to local input/output data lines LI0/LI0Z. When the block selection signal bs is applied to the block selection unit 120, data is transmitted to the sub input/output lines SIO/SIOZ. When the column access signal Yi is applied to the column selection unit 130, data is transmitted through the bitline sense amplifier 140 and to the memory cell 150 selected by a wordline and a bitline. If the data is masked at this time, data is not written in the memory cell 150.

When the write data masking signal wdm is inputted into the write driver 110 to mask the data, in the global input/output lines GIO/GIOZ, data is not transmitted to the local input/output lines LIO/LIOZ. However, a dummy column access signal is generated because control signals, except data, are not masked. When the undesired column access signal is applied to a second NMOS transistor NM2 in the column selection unit 130, voltage of the sub input/output lines SIO/SIOZ, which is precharged to Vintc, is applied to the bitline bar blz so that the voltage level of the bitline bar blz increases. If a precharge command is applied and the word line transistor NM3 is turned off before the voltage level of the bitline bar blz returns to the original voltage level, the increased voltage is written in the memory cell 150 so that the data stored in the memory cell 150 is lost. Therefore, normal operation of the semiconductor memory device cannot be expected.

SUMMARY OF THE INVENTION

It is, therefore, an object of the present invention to provide a semiconductor memory device capable of masking a dummy column access signal by using a write data masking signal.

In accordance with an aspect of the present invention, there is provided a semiconductor memory device, comprising: a masking means for masking the generation of a column access signal by using a write data masking signal, wherein the masking means includes: a control signal generating means for receiving control signals including a write data masking signal, a column address signal and a read/write strobe signal and outputting a control signal to prevent the enabling of an undesired column access signal and a column address decoding means for outputting a column access signal in response to the control signal from the control signal generating means.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE PREFERRED EMBODIMENTS

Hereinafter, a semiconductor memory device for masking inputted data that is to be written in a memory cell by using a data masking signal will be described in detail with reference to the accompanying drawings.

Figure 1A:
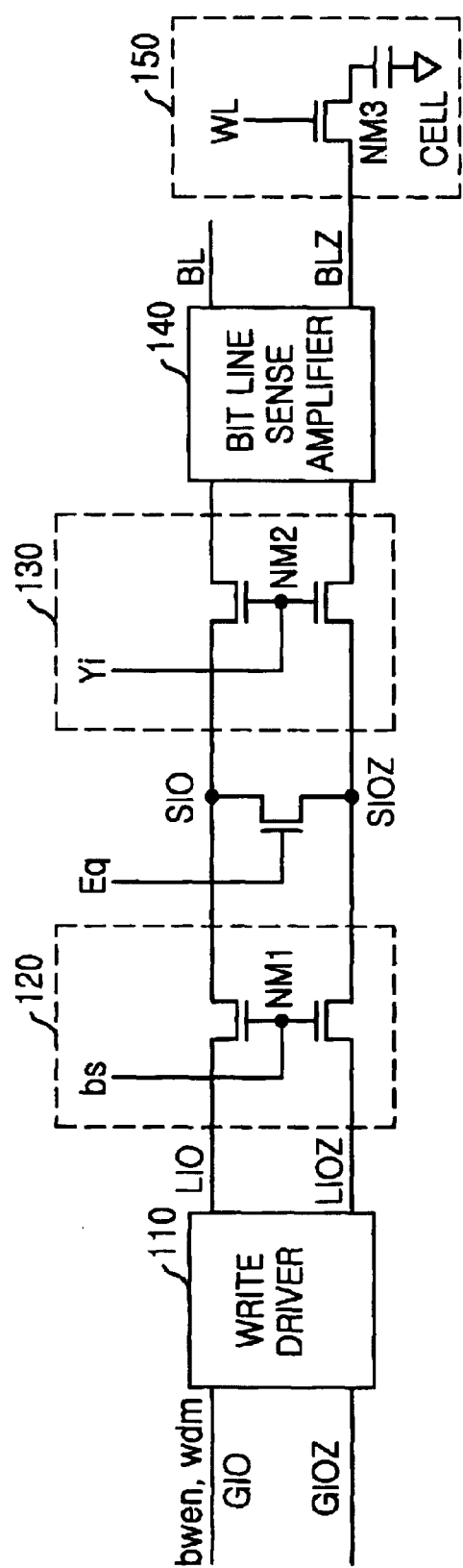
FIG. 1A is a schematic circuit diagram showing a path to write data in a memory cell according to the prior art.
Figure 1B:
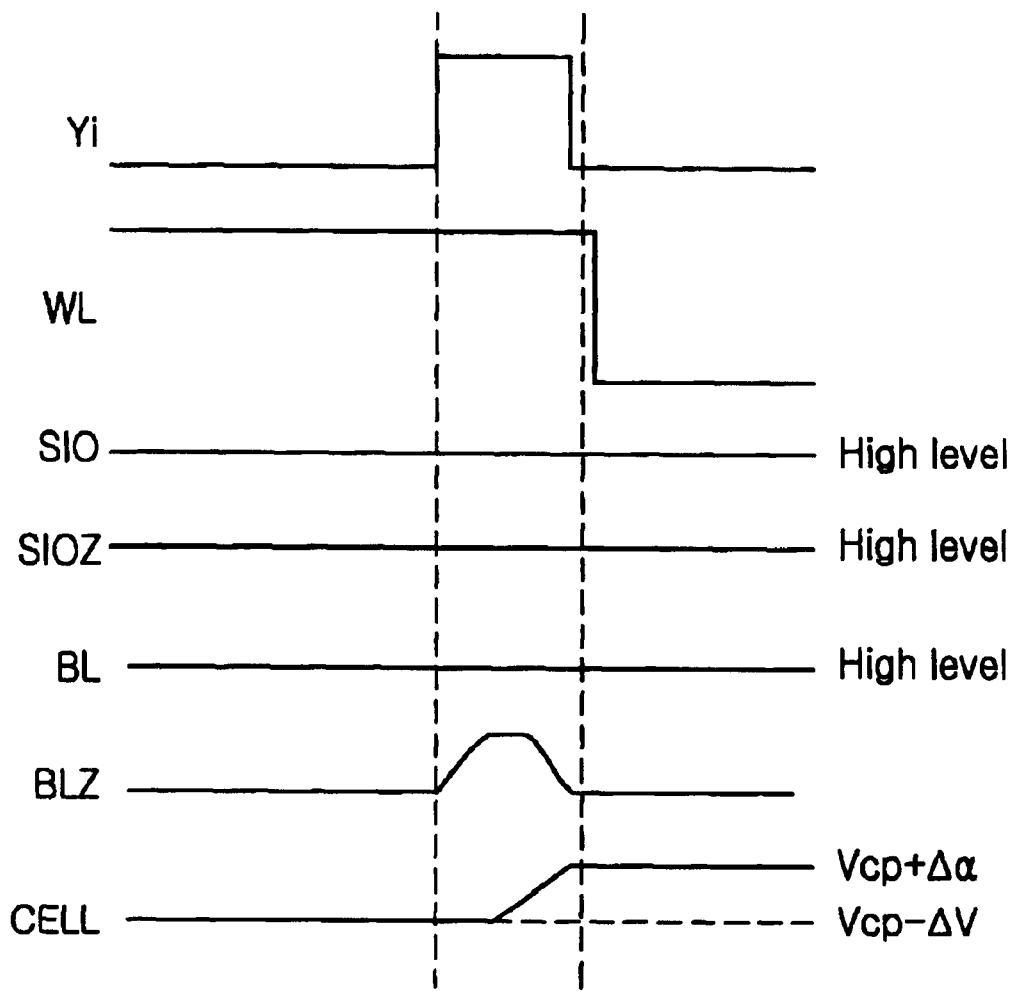
FIG. 1B is a timing chart for the circuit diagram of the prior art shown in FIG. 1A.
Figure 2:
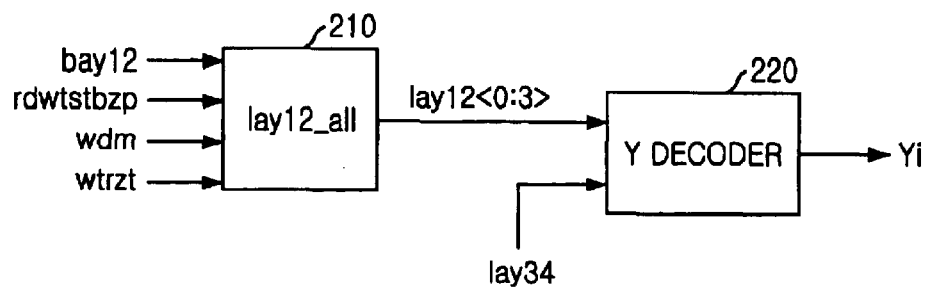
FIG. 2 is a schematic block diagram showing the generation of a column access signal according to the present invention.

FIG. 2 is a schematic block diagram showing the generation of a column access signal Yi through a lay12_all block 210, which is a predecoder, and a Y decoder 220 according to the present invention.

The lay12_all block 210 is a circuit to transform a bay12 signal, which is a pre-decoded column address level signal, into a lay12 signal, which is a pulse signal having a level of a desired range for controlling the Y decoder 220. The bay12 signal, a read/write strobe rdwtstbzp signal and a write data masking signal wdm are inputted into the lay12_all block 210. The write data masking signal wdm masks the lay12 signal, wherein the lay12 signal is composed of the bay12 signal and the read/write strobe signal rdwtstbzp, so that a generation of an undesired column access signal from the column address decoder 220 is prevented. A decoding process is carried out in the column address decoder 220 when the lay12 signal has a logic value of 'high'.

Now, the lay12_all block 210 will be described in detail.

Figure 3:
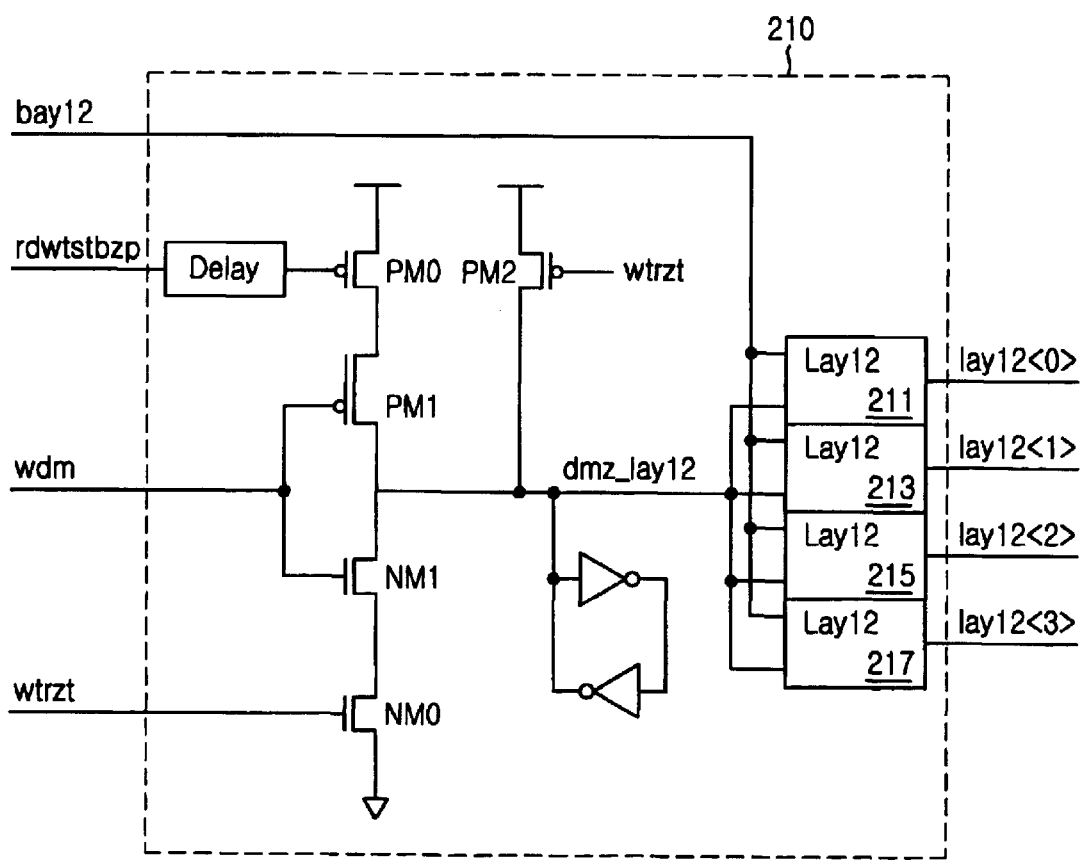
FIG. 3 is a circuit diagram showing the lay12_all block shown in FIG. 2 according to the present invention.

FIG. 3 is a detailed circuit diagram showing the lay12_all block.

Referring to FIG. 3, a write read bar signal wtrzt, which has a logic value of 'high' in the case of data write and a logic value of 'low' in the case of data read, is inputted into the lay12_all block 210 together with other signals.

When data is written in a memory cell, the read write bar signal wtrzt is transited into logic value 'high'. Accordingly, the first NMOS transistor NM1 is turned on and the third PMOS transistor PM2 is turned off. At this time, the read write strobe signal rdwtstbzp has a logic value of 'low' and the write data masking signal wdm has a logic value of 'high' so that the data masking bar signal dmz_lay12 becomes a logic value of 'low'. The data masking bar signal dmz_lay12, which has a logic value of 'low', is inputted into the lower lay12 blocks 211, 213, 215 and 217 of the lay12_all block 210. The lower lay12 blocks 211, 213, 215 and 217 generate Y decoder decoding signals lay12<0:3>.

Figure 4:
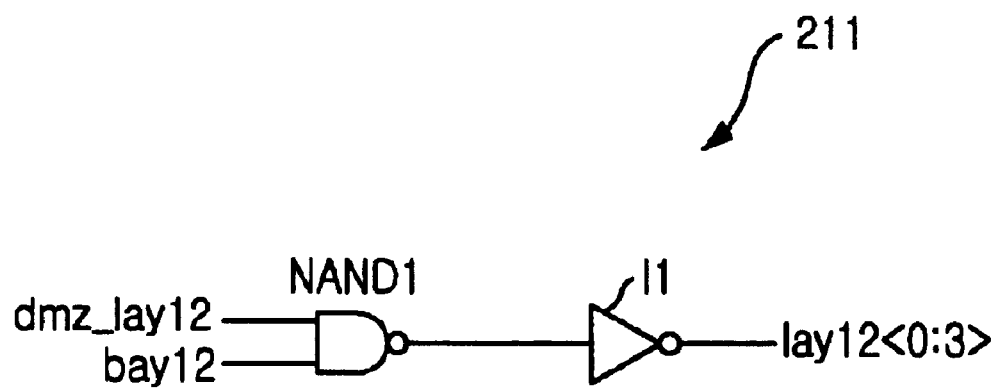
FIG. 4 is a circuit diagram showing the lay12 block of FIG. 3 according to the present invention.

FIG. 4 is a detailed circuit diagram showing the lower lay12 blocks 211, 213, 215 and 217.

Referring to FIG. 4, the data masking bar signal dmz_lay12 and the bay12 signal are inputted into the first NAND gate NAND1 wherein the output signal of the first NAND gate NAND1 is inverted in an inverter I1. The output signal of the inverter I1 is the Y decoder decoding signal lay12<0:3>, which is the output signal of the lay12_all block 210.

When the data masking bar signal dmz_lay12 is transited into a logic value of 'low', the output signal of the first NAND gate NAND1 becomes a logic value of 'high', independent of the logic value of the bay12 signal. The bay12 signal is a predecoding signal of the column address signal. The output of the first NAND gate NAND1 is inverted into a signal with a logic value of 'low' in the inverter I1.

In FIG. 2, a decoding process is carried out in the Y decoder when the Y decoder decoding signals lay12<0:3> have a logic value of 'high'. This is to prevent the generation of an undesired column access signal.

Accordingly, when the data masking signal is used to input the precharge command after inputting the write command, the loss of data stored in the memory cell can be prevented. Thus, a normal operation of the semiconductor memory device is expected.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a masking means for masking the generation of a column access signal by using a write data masking signal, wherein the masking means includes:
     a control signal generating means for receiving control signals including a write data masking signal, a column address signal, a read/write strobe signal and a write/read bar signal which becomes a logic value of 'high' in a write operation and a logic value of 'low' in a read operation, and for outputting a control signal to prevent enablement of an undesired column access signal; and
     a column address decoding means for outputting a column access signal in response to the control signal from the control signal generating means.

2. The semiconductor memory device as recited in claim 1, wherein the control signal generating means is a predecoder of the column address decoding means.

3. The semiconductor memory device as recited in claim 2, wherein the control signal generating means includes:
   a first signal generating means for generating a data write masking bar signal in response to the read/write strobe signal, the write data masking signal and the write/read bar signal, wherein the first signal generating means includes a first PMOS transistor driven by the read/write strobe signal, a second PMOS transistor driven by the write data masking signal, a first NOMS transistor driven by the write data masking signal, a second NMOS transistor driven by the write/read bar signal, a third PMOS transistor driven by the write/read bar signal and a latch circuit; and
   a second signal generating means for generating said control signal to control said column address decoding means, wherein the second signal generating means includes a NAND gate for applying the data masking bar signal and the column address signal and an inverter for inverting the output signal of the NAND gate and for outputting a decoding signal of the column address decoding means.

4. The device as recited in claim 3, wherein the column address decoding means is operated only when the decoding signal of the column address decoding means has a logic value of 'high'.

* * * * *